(12) United States Patent
Lai et al.

(10) Patent No.: US 6,873,929 B2
(45) Date of Patent: Mar. 29, 2005

(54) HEAT DISSIPATION SYSTEM USED IN ELECTRONIC DEVICE

(75) Inventors: Chih-Min Lai, Kaohsiung (TW); Ren-Cheng Chao, Taipei (TW)

(73) Assignee: Benq Corporation, Taoyuan (TW)

( * ) Notice: Subject to any disclaimer, the term of this patent is extended or adjusted under 35 U.S.C. 154(b) by 61 days.

(21) Appl. No.: 10/434,134

(22) Filed: May 8, 2003

(65) Prior Publication Data

US 2003/0216882 A1 Nov. 20, 2003

(30) Foreign Application Priority Data

May 16, 2002 (TW) ........................................ 91206995 U

(51) Int. Cl.⁷ .............................................. G06F 15/00
(52) U.S. Cl. ..................................... 702/132; 702/130
(58) Field of Search .......................... 165/295; 702/127, 702/130, 132, 133; 62/119; 219/400, 553

(56) References Cited

U.S. PATENT DOCUMENTS

| | | | | |
|---|---|---|---|---|
| 4,756,473 A | * | 7/1988 | Takemae et al. | 236/49.3 |
| 5,102,040 A | * | 4/1992 | Harvey | 236/49.3 |
| 6,005,762 A | * | 12/1999 | Hiroi | 361/103 |
| 6,011,689 A | * | 1/2000 | Wrycraft | 361/695 |
| 6,101,459 A | * | 8/2000 | Tavallaei et al. | 702/132 |
| 6,104,003 A | * | 8/2000 | Jones | 219/400 |
| 6,127,663 A | * | 10/2000 | Jones | 219/553 |
| 6,181,556 B1 | * | 1/2001 | Allman | 361/690 |
| 6,188,189 B1 | * | 2/2001 | Blake | 318/471 |
| 6,191,546 B1 | * | 2/2001 | Bausch et al. | 318/471 |
| 6,215,660 B1 | * | 4/2001 | Lin | 361/695 |
| 6,487,074 B1 | * | 11/2002 | Kimura et al. | 361/695 |
| 6,487,463 B1 | * | 11/2002 | Stepp, III | 700/79 |
| 2003/0100959 A1 | * | 5/2003 | Liu | 700/21 |
| 2003/0137267 A1 | * | 7/2003 | Blake | 318/471 |
| 2003/0234630 A1 | * | 12/2003 | Blake | 318/471 |
| 2004/0004817 A1 | * | 1/2004 | Greco | 361/697 |
| 2004/0012923 A1 | * | 1/2004 | Chen | 361/687 |

* cited by examiner

*Primary Examiner*—Michael Nghiem
*Assistant Examiner*—Douglas N Washburn
(74) *Attorney, Agent, or Firm*—Snell & Wilmer L.L.P.

(57) ABSTRACT

A heat dissipation system used in an electronic device includes a casing, an inlet, an outlet, two thermal sensors, at least one fan, and a microprocessor. The fan is disposed in the casing and configured to guide airflow into the casing through the inlet and out of the casing through the outlet. The two thermal sensors are disposed in the casing and respectively located near the inlet and the outlet to measure a first temperature and a second temperature. The microprocessor has at least one relation table, which is a function of ratio of the second temperature to the first temperature, between the first temperature and speed of the fan. The microprocessor selects one relation table in accordance with the ratio of the second temperature value to the first temperature value to control the speed of the first fan according to the first temperature.

6 Claims, 7 Drawing Sheets

HEAT DISSIPATION SYSTEM USED IN ELECTRONIC DEVICE

CROSS REFERENCE TO RELATED APPLICATIONS

This application claims priority to Taiwan Patent Application No. 091206995 entitled "Heat Dissipation System Used in Electronic Device", filed May 16, 2002.

FIELD OF THE INVENTION

The present invention relates to a heat dissipation system used in electronic devices and, more particularly, to a heat dissipation system which effectively provides heat dissipation effect in various environments.

BACKGROUND OF THE INVENTION

When electronic apparatus, e.g. projectors, are operating, heat is increasingly generated. For example, when a projector is in use, the projecting light source as well as other electronic components inside the projector generate a great deal of heat. In general, a heat dissipation system is implemented to dissipate the heat and to prevent electronic apparatus from over-heat shorting their lives. When the inner temperature of the electronic apparatus exceeds the designed operating temperature, the electronic apparatus fails. Among many dissipation techniques, one is to utilize the air to cool the device. In this case, a fan is often configured to guide a cooling airflow in and out of the casing taking away the heat.

As shown in FIG. 1, a conventional heat dissipation system is illustrated. An electronic device having a casing 10 includes an inlet 132 and an outlet 134. A fan 122 is disposed close to the inlet 132 of the casing 10 for guiding airflow into the casing 10 through the inlet 132. A fan 124 is disposed close to the outlet 134 for guiding the airflow out of the casing 10 through the outlet 134. The faster the fans 122 and 124 rotate, the better the heat dissipation. However, the noise accordingly escalates. To reduce the unnecessary noise, the fans 122 and 124 rotate at a less speed providing sufficient heat dissipation when the inner temperature is lower. When the inner temperature increases, the fans 122 and 124 rotate faster so as to provide more effective heat dissipation. The relation between the temperature and the speed of the fan is controlled by the microprocessor 102. Accordingly, a thermal sensor 104 is disposed near the inlet 132 to detect the corresponding temperature, and a signal representing the temperature is then transmitted from the thermal sensor 104 to the microprocessor 102 through a signal line 112. Through signal lines 114 and 116, the microprocessor 102 transmits control signals to the fans 122 and 124 to control their rotation speeds. A relation between the temperature and the speed of the fan, which is indicated by a curve shown in FIG. 2, is stored in the microprocessor 102.

FIG. 2 depicts a relationship between the temperature and the rotation speed of the fan. For example, when the temperature detected by the thermal sensor 104 is less than the temperature $T_0$, the fan will remain at a lower rotation speed $R_0$. $R_0$ represents the rotation speed of the fan when the system is initiated. When the temperature detected by the thermal sensor 104 ramps upwards to $T_a$, the microprocessor 102 increases the speeds of the fans 122 and 124 to $R_a$ to improve the heat dissipation effect. Thereafter, as the temperature detected by the thermal sensor 104 ramps upwards to $T_b$, the microprocessor 102 continues to increase the speeds of the fans 122 and 124 to $R_b$. Thus, while the temperature detected by the thermal sensor 104 is between $T_0$ and $T_m$, the microprocessor 102 adjusts the speeds of the fans 122 and 124 depending on the relationship of inner temperature and the fan speed. In addition, when the detected temperature exceeds $T_m$, the fan rotation speed will no longer increase, i.e. $R_m$, representing the highest rotation speeds of the fans 122 and 124. As a result, the working temperature of the electronic device cannot exceed $T_m$, the design temperature.

FIG. 3 depicts a flowchart of operating the conventional heat dissipation system. First, in Step 202, the thermal sensor detects the temperature T. In Step 204, the temperature T is transmitted to the microprocessor 102. In Step 206, the microprocessor 102 determines whether the temperature T is greater than $T_0$, which represents a value pre-stored in the microprocessor 102. As the temperature T is less than $T_0$, in Step 208, the microprocessor 102 will maintain the fan speed at $R_0$. As the temperature T is greater than $T_0$, in Step 210, the microprocessor 102 determines whether the temperature T is less than $T_m$, which represents another value pre-stored in the microprocessor 102. Accordingly, when the temperature T is above $T_m$, in Step 212, the microprocessor will maintain the fan speed at $R_m$. When the temperature T is between $T_0$ and $T_m$, the microprocessor 102 determines whether the temperature T changes, as shown in Step 214. If no, in Step 216, the microprocessor 102 will still maintain the fan at the current speed. If yes, in Step 218, the microprocessor 102 chooses one corresponding speed from the relation table between the temperature value and the fan speed, and transmits the control signals to the fans 122 and 124 through the signal lines 114 and 116 to further adjust the fan speeds improving heat dissipation effect.

The environment in which the electronic device is used may be altered. When the electronic device is operated in an atmospheric pressure less than 1 bar, the air density is lower, and therefore the conventional heat dissipation system will face the challenge. When the atmospheric pressure is less than 1 bar, the fan generates less airflow at the same speed compared with the fan operating in a higher atmospheric pressure. As a result, even if the rotation speed keeps the same, the conventional heat dissipation system shown in FIG. 1 cannot effectively dissipate heat. When the fan generates less airflow due to lower air density, the airflow can take away much less heat, thus resulting in ineffective heat dissipation. If the temperature detected by the thermal sensor 104 is unchanged, the microprocessor 102 is unlikely to increase the speeds of the fans 122 and 124. As the heat accumulated inside the device, the electronic device may malfunction at any time due to abnormal temperature or aging components.

SUMMARY OF THE INVENTION

It is one aspect of the present invention to provide a heat dissipation system, which effectively provides heat dissipation effect in various environments.

It is another aspect of the present invention to provide a heat dissipation system, which provides effective heat dissipation even when electronic device is operating in less dense atmospheric pressure environment.

A heat dissipation system used in an electronic device includes a casing, an inlet located on the casing and outlet located on the casing. A fan is disposed in the casing for guiding airflow into the casing through the inlet and out of the casing through the outlet. A first thermal sensor configured to detect a first temperature value is disposed near the inlet in the casing. A second thermal sensor configured to detect a second temperature value is disposed near the outlet in the casing. A microprocessor has at least one relation table, which is a function of ratio of the second temperature to the first temperature, between the first temperature and speed of the fan. The microprocessor selects one relation table in accordance with the ratio of the second temperature value to the first temperature value to control the speed of the first fan according to the first temperature.

DETAILED DESCRIPTION

A heat dissipation system, which provides effective heat dissipation in various environments, is provided. Two thermal sensors are respectively disposed near the inlet and outlet of a casing to detect the corresponding temperature. The fan speed is adjusted according to the measured temperature values to improve the heat dissipation effect in the higher altitude environment.

Figure 1:
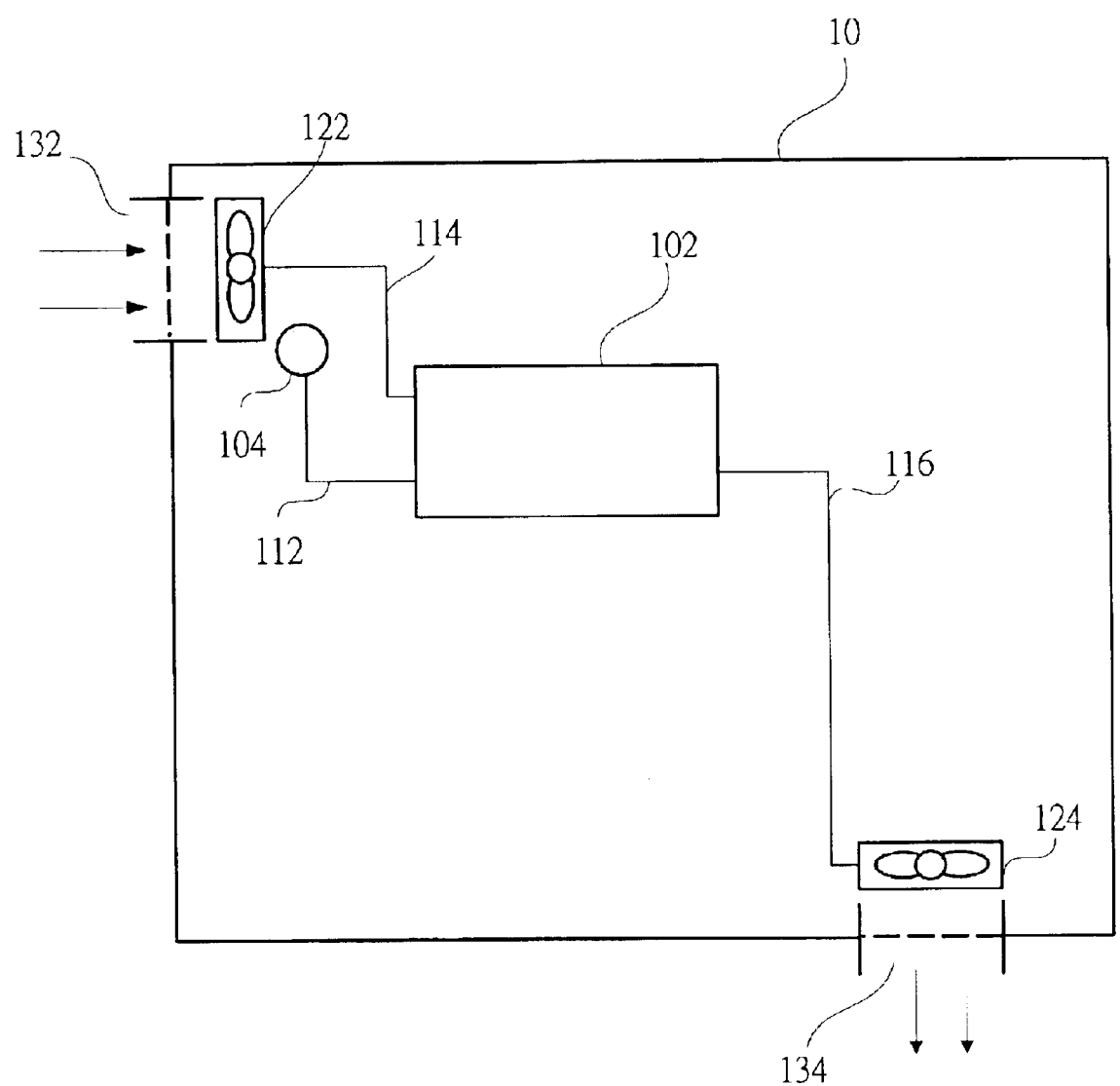
FIG. 1 depicts a conventional heat dissipation system used in an electronic device.
Figure 2:
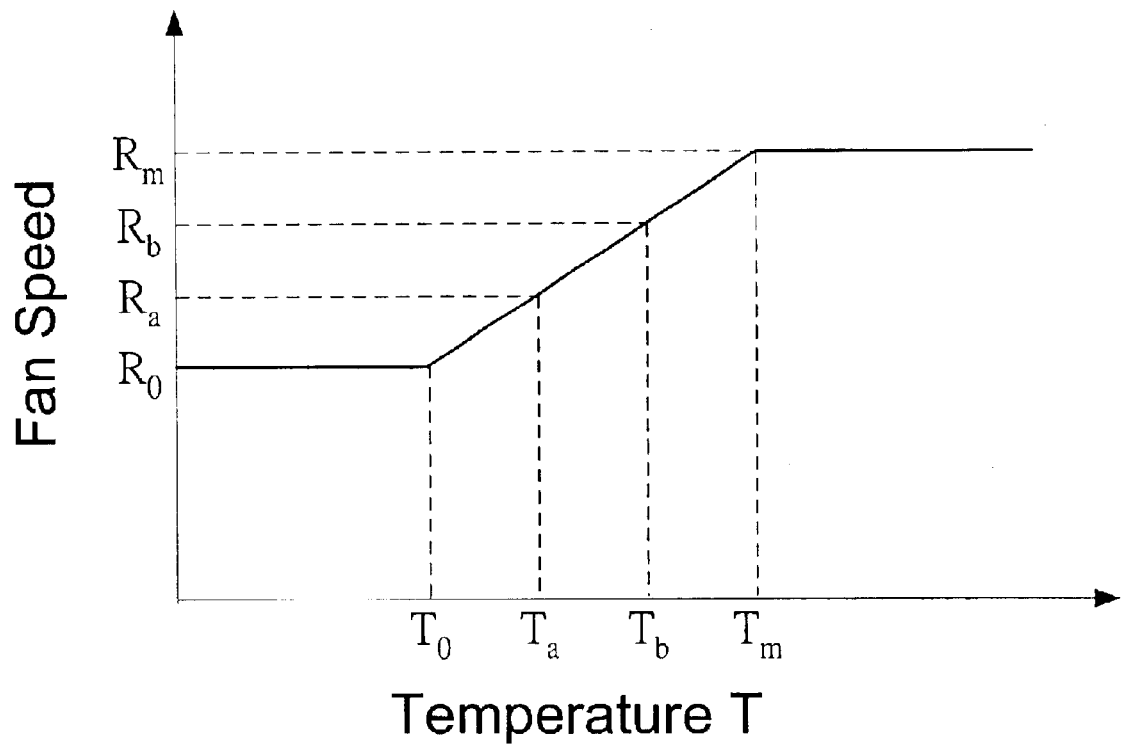
FIG. 2 depicts a conventional relation diagram between the temperature and the rotation speed of the fan.
Figure 3:
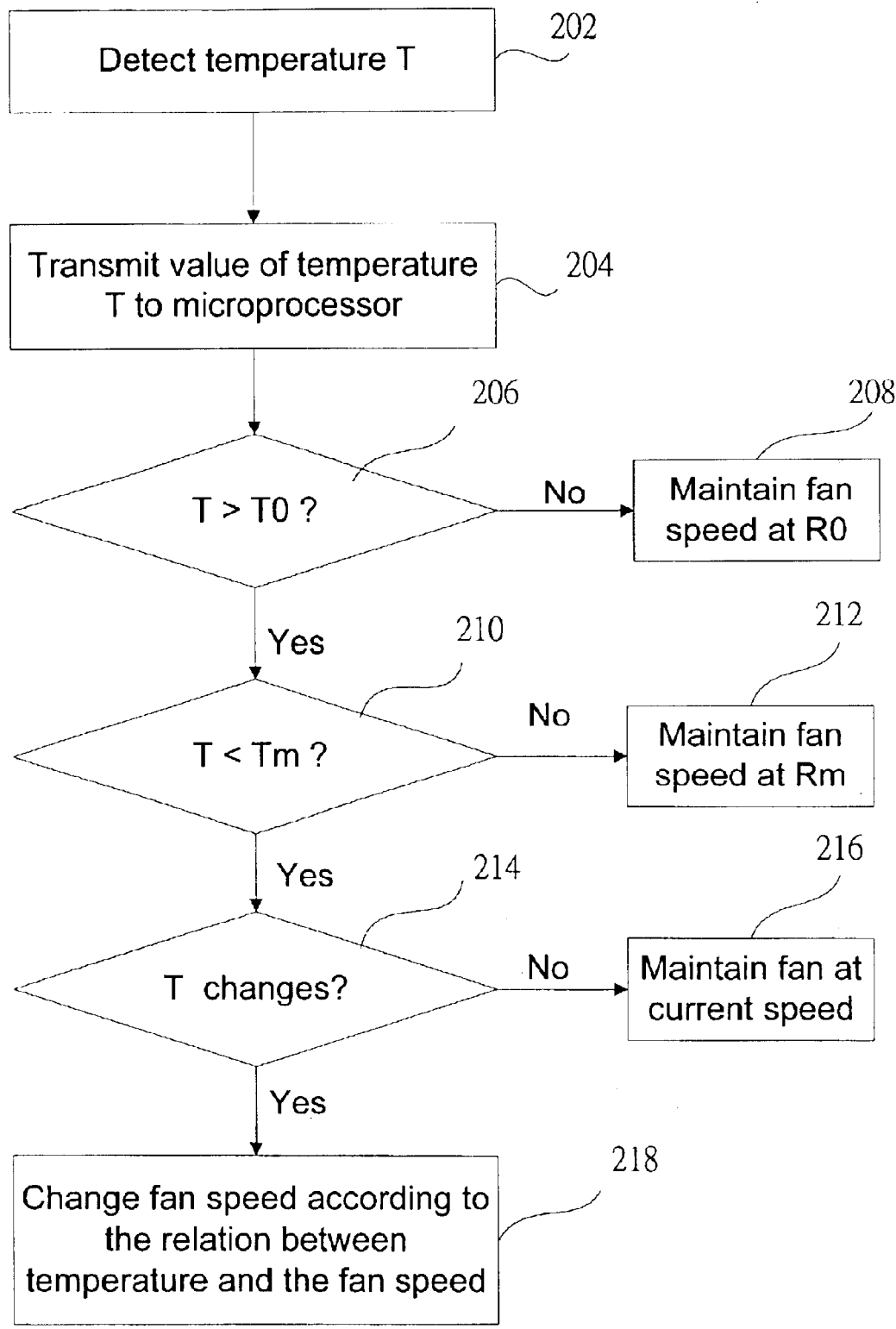
FIG. 3 depicts a flowchart of operating a conventional the heat dissipation system.
Figure 4:
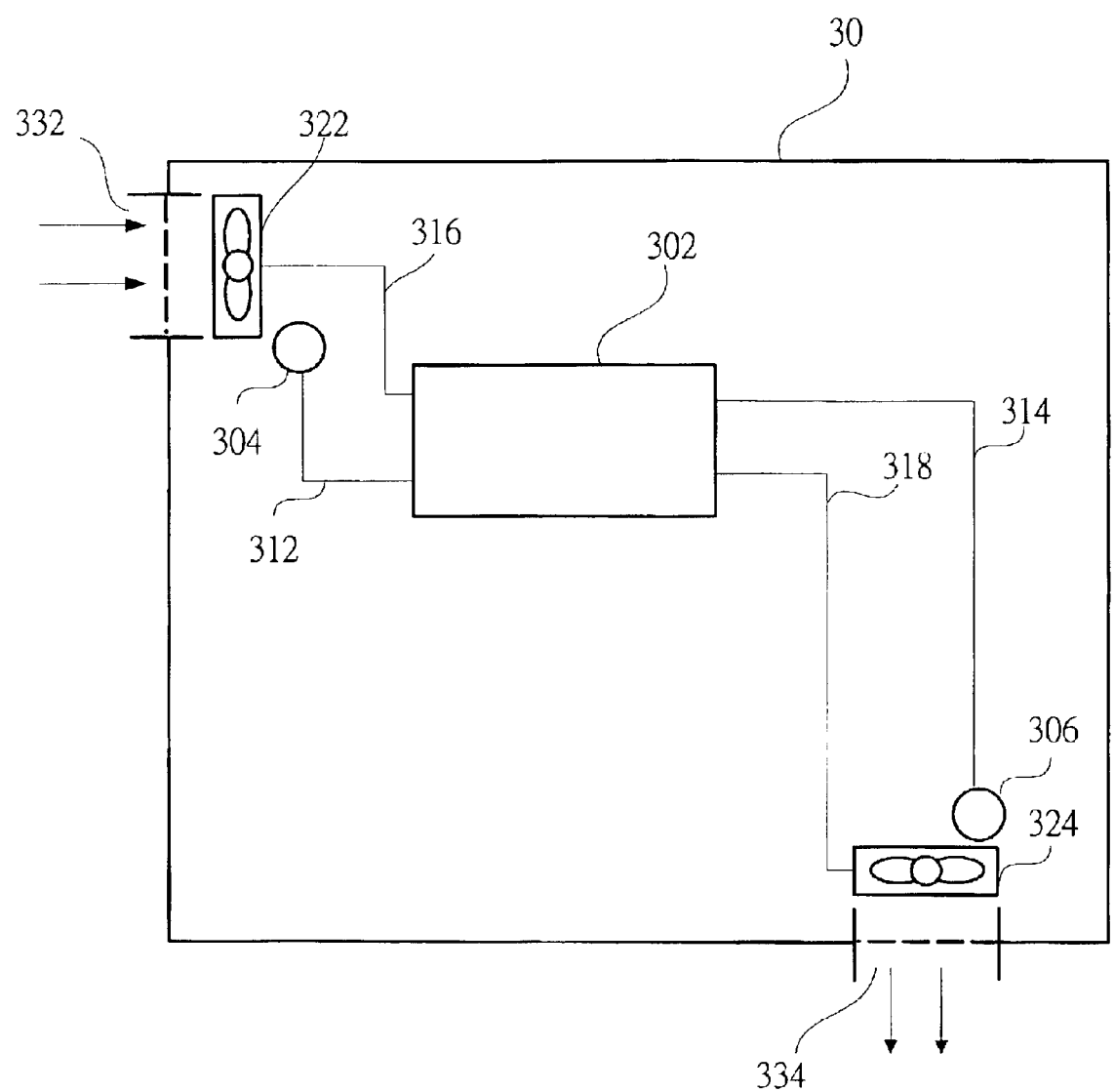
FIG. 4 is a schematic diagram showing airflow, guided by fans 322 and 324, flowing in and out of the casing in accordance with a first embodiment of the present invention.

FIG. 4 depicts a preferred embodiment of the present invention. An inlet 332 and outlet 334 are both disposed on a casing 30 of an electronic device. The locations of the inlet 323 and outlet 324 on the casing 30 are not limited to those shown in FIG. 4, but can vary with the design need. Fans 322 and 324 are respectively disposed near the inlet 332 and outlet 334. The fan 322 is configured to guide airflow into the casing 30 through the inlet 332, as indicated by the arrows. The fan 324 is configured to guide the airflow out of the casing 30 through the outlet 332, as also indicated by the arrows.

In order to operate the fan, a microprocessor 302, which can be located within the casing 30, is configured to transmit the control signals, through signal lines 316 and 318 respectively, to control the rotation speeds of the fans 322 and 324. A first thermal sensor 304 and a second thermal sensor 306 are respectively disposed in the casing 30 near the inlet 332 and outlet 334 to detect the temperatures as air flowing into the casing 30 and out of the casing 30. The first and second thermal sensors, 304 and 306, respectively detect a first temperature $T_1$ and a second temperature $T_2$, which are transmitted through the signal lines 312 and 314 to the microprocessor 302. The microprocessor 302 controls the rotation speeds of the fans to provide effective heat dissipation in accordance with the temperatures measured by the first thermal sensor 304 and second thermal sensor 306.

Figure 5:
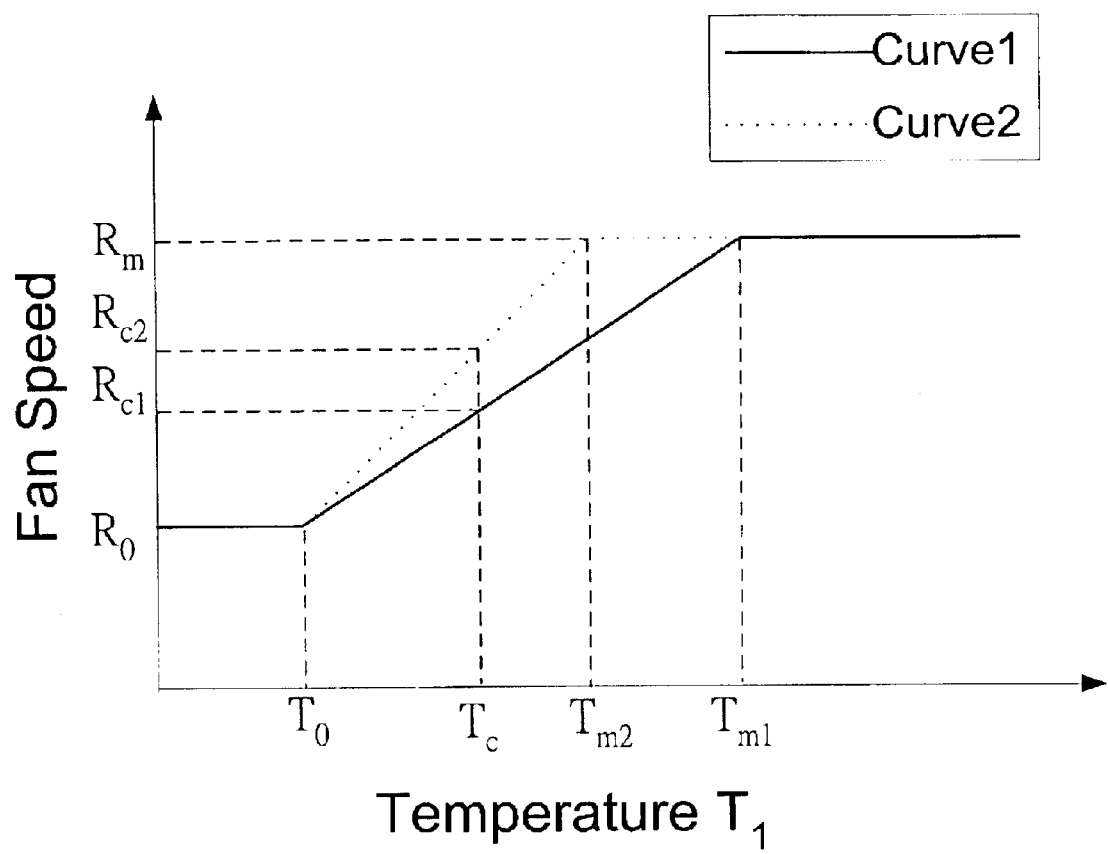
FIG. 5 depicts a relation diagram between the temperature $T_1$ and the fan speed in accordance with the present invention.

The method of controlling the fan speed based on two curves is shown in FIG. 5. The values of $R_0$ and $R_m$ respectively represent the lowest and the highest rotation speed of the fan, and the corresponding temperatures of $T_1$ are $T_0$ and $T_{m1}$ respectively. Curve 1 represents a relation between the first temperature $T_1$ and the fan speed when the electronic device is operated under a common circumstance, e.g. the atmospheric pressure of about 1 bar. When the electronic device is operated in different environments, for example, in a lower pressure environment of about 679 mbar, the heat generated and accumulated in the system cannot be effectively vacated from the casing 30 by the generated airflow of the existing fan speed. Accordingly, the fan speed should be increased to take away more heat. In other words, a new relation between the fan speed and the temperature, Curve 2, is implemented. Curve 2 represents a relation between the fan speed and the temperature when the atmospheric pressure is much lower.

The microprocessor 302 chooses Curve 2 by the following method. When the first temperature $T_1$ detected by the first thermal sensor is $T_c$, which is in the range between $T_0$ and $T_{m1}$, the fan speeds corresponding to Curve 1 and 2 are respectively $R_{c1}$ and $R_{c2}$. The microprocessor 302 has two pre-stored values $M_{C1}$ and $M_{C2}$ for determining which curve should be used. The microprocessor 302 determines whether the temperature ratio of the second temperature to the first temperature ($T_2/T_c$) is close to $M_{C1}$ or $M_{C2}$ to select the adequate operation curve. When the $T_2/T_c$ is close to $M_{C1}$, the Curve 1 is selected to control the fan speed and $R_{c1}$ is obtained. When the $T_2/T_c$ is close to $M_{C2}$, the Curve 2 is selected to control the fan speed and $R_{c2}$ is obtained. Furthermore, if the heat dissipation system has a second fan disposed in the inlet, the microprocessor 302 can adjust the rotation speed of the second fan when the speed of the first fan is adjusted.

FIG. 5 depicts two curves 1 and 2, which respectively correspond to two different atmospheric pressure environments. However, the spirit of the present invention extends to more than two curves for more effective heat dissipation operation.

Figure 6:
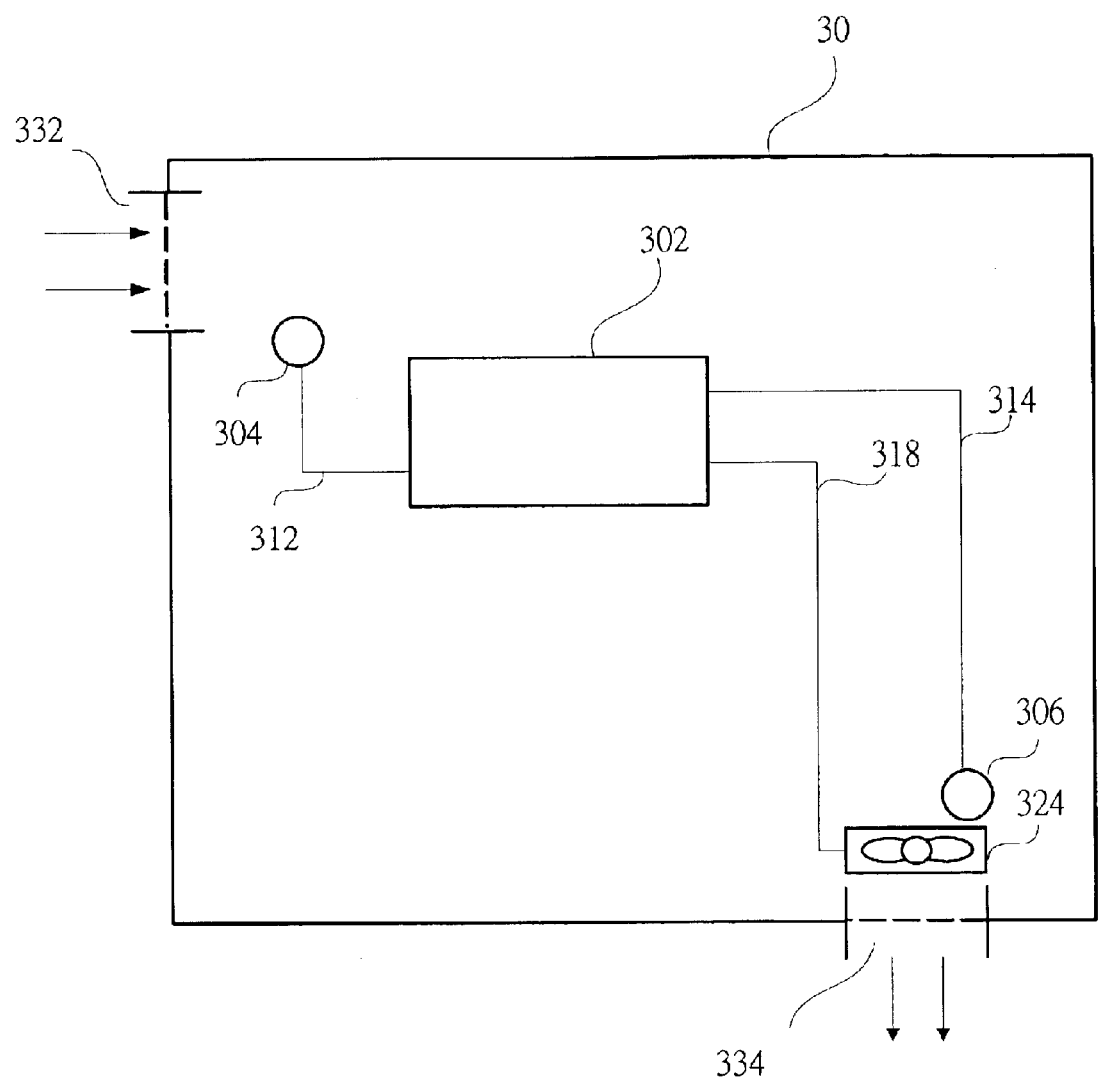
FIG. 6 is a schematic diagram showing airflow, guided by fan 324, flowing in and out of the casing in accordance with a second embodiment of the present invention.

FIG. 6 depicts another preferred embodiment of the present invention. The difference between the FIGS. 6 and 4 is only one fan is provided to propel airflow in FIG. 6. To propel the airflow, the fan 324 is disposed according to the locations of the inlet 332 and outlet 334. As shown in FIG. 6, the fan 324 is disposed near the outlet 334 for propelling the airflow out of the outlet 334, and the cool air outside the casing 30 flows into the casing 30 through the inlet 332 resulting in air circulation and heat dissipation. Other aspects of the embodiment are similar to FIG. 4.

Figure 7:
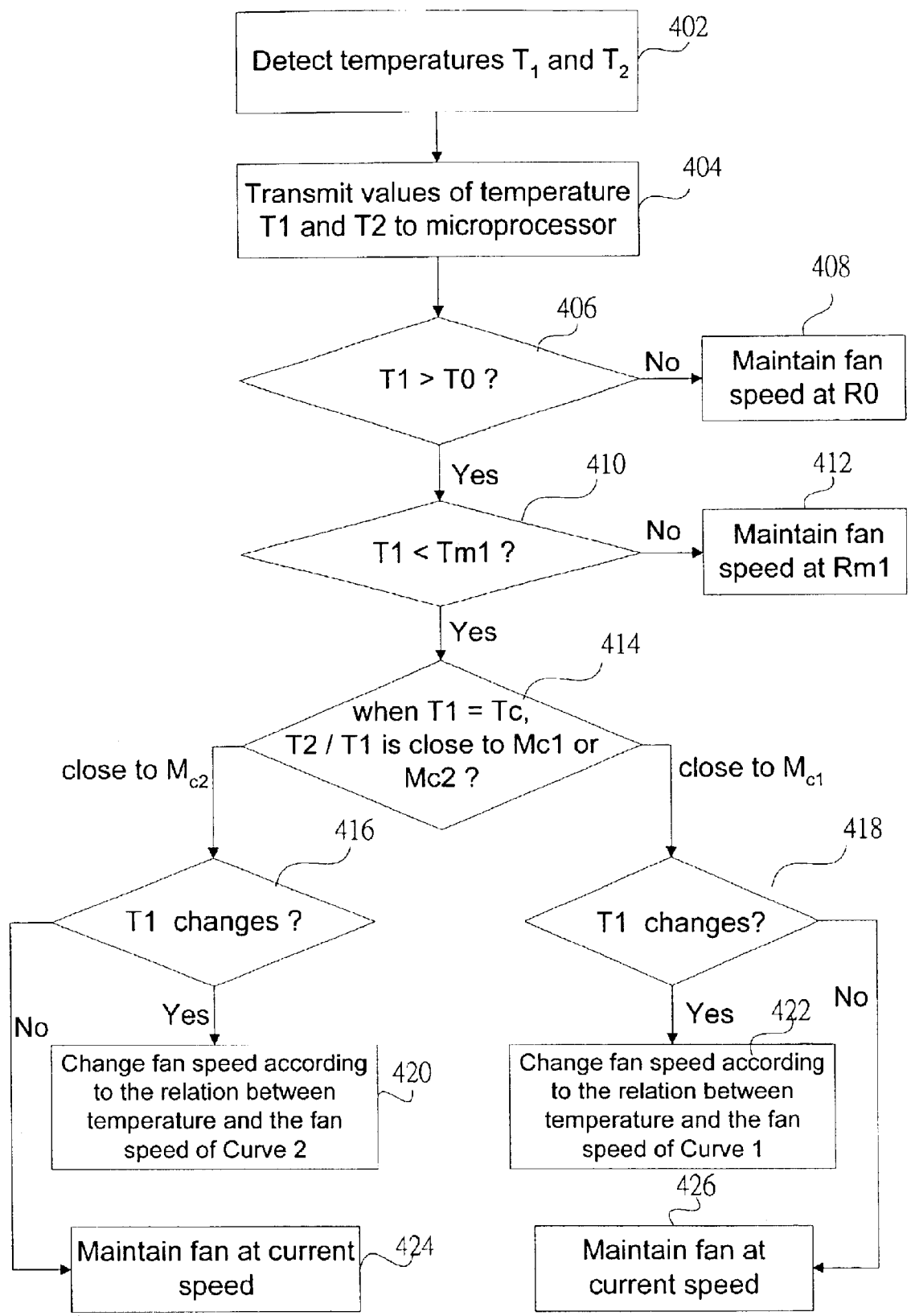
FIG. 7 depicts a flowchart of operating the heat dissipation system in accordance with the present invention.

FIG. 7 depicts a flowchart of operating the heat dissipation system in accordance with the present invention. In Step 402, when the electronic device is operated, the first thermal sensor 304 and second thermal sensor 306 respectively detect the temperatures $T_1$ and $T_2$. In Step 404, both the first temperature $T_1$ and the second temperature $T_2$ are transmitted to the microprocessor 302. Then, in Step 406, the microprocessor 302 determines whether the temperature $T_1$ is greater than $T_0$, a value pre-stored in the microprocessor 302. When the temperature $T_1$ is less than the $T_0$, the microprocessor 302 maintains the fan operating at the lowest speed $R_0$ in Step 408. Then in Step 410, when the temperature $T_1$ is higher than the $T_0$, the microprocessor 302 determines whether the temperature $T_1$ is greater than another pre-stored higher value $T_{m1}$. When the temperature $T_1$ is greater than $T_{m1}$, the microprocessor 302 maintains the fan operating at the highest speed $R_m$ in Step 412.

When the temperature $T_1$ is in the range between $T_0$ and $T_{m1}$, the Step 414, which determines whether the $T_2/T_1$ is close to the values $M_{C1}$ or $M_{C2}$, is performed. The values of $M_{C1}$ and $M_{C2}$ are pre-stored in the microprocessor 302 respectively corresponding to Curve 1 and Curve 2, when the temperature $T_1$ equals to $T_C$. In Step 416, when the temperature ratio ($T_2/T_c$) is close to $M_{C2}$, Curve 2 is selected and the step of determining whether the temperature $T_1$ changes is performed. When the temperature $T_1$ changes, in Step 420, the fan speed is adjusted in accordance with Curve 2. When the temperature $T_1$ does not change, in Step 424, the fan is maintained at the current operating speed. Furthermore, in Step 418, then the $T_2/T_c$ is close to $M_{C1}$, Curve 1 is selected and the step of determining whether the temperature $T_1$ changes is performed. When the temperature $T_1$ changes, in Step 422, the fan speed is adjusted according to Curve 1. When the temperature $T_1$ does not change, in Step 426, the fan is maintained at the current operating speed.

The present invention has been described above with reference to a preferred embodiment. However, those skilled in the art will recognize that many others may be implemented in alternate ways without departing from the scope of the present invention. Accordingly, the present exemplary embodiment is provided to illustrate rather than to limit the scope of the invention. The present invention is not limited to the details described above and can be practiced with an equivalent modification or change to the invention as defined in the appended claims.

We claim:

1. A heat dissipation system used in an electronic device, comprising:

a casing;

an inlet located on the casing;

an outlet located on the casing;

a first fan disposed in the casing for guiding an airflow into the casing through the inlet and out of the casing through the outlet;

a first thermal sensor disposed in the casing and near the inlet, the first thermal sensor detecting a first temperature value;

a second thermal sensor disposed in the casing and near the outlet, the second thermal sensor detecting a second temperature value; and a microprocessor located in the casing to control a speed of the first fan, the microprocessor storing M groups of relation tables between the first temperature value and the speed of the first fan, M groups of relation tables are functions of a ratio of the second temperature value to the first temperature value;

wherein, the microprocessor chooses one relation table from the M groups of relation tables in accordance with the ratio of the second temperature value to the first temperature value, and the microprocessor controls the speed of the first fan in accordance with the first temperature.

2. The heat dissipation system of claim 1, the microprocessor further storing a plurality of comparison values, the microprocessor determining the speed of the first fan by comparing the ratio of the second temperature value to the first temperature value with the comparison values.

3. The heat dissipation system of claim 1, wherein the first fan is disposed near the outlet.

4. The heat dissipation system of claim 3, further comprising a second fan near the inlet to guide the airflow into the casing through the inlet.

5. The heat dissipation system of claim 4, wherein the microprocessor controls a speed of the second fan.

6. An electrical device having adaptive heat dissipation functions, comprising:

a casing;

an inlet located on the casing;

an outlet located on the casing;

a plurality of temperature N sensors located about the casing, wherein at least a first one of the temperature sensors is located proximate the inlet and at least a second one of the temperature sensors is located proximate the outlet; and a microprocessor located within the casing to control a speed of a fan located proximate the inlet or outlet, the microprocessor storing M groups of relation tables, where M=N.

* * * * *